United States Patent
Lotz

(10) Patent No.: US 9,856,554 B2
(45) Date of Patent: Jan. 2, 2018

(54) METHOD AND SYSTEM FOR MANUFACTURING A TRANSPARENT BODY FOR USE IN A TOUCH PANEL

(75) Inventor: Hans-Georg Lotz, Gründau-Rothenbergen (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 544 days.

(21) Appl. No.: 14/343,125

(22) PCT Filed: Sep. 7, 2011

(86) PCT No.: PCT/EP2011/065478
§ 371 (c)(1),
(2), (4) Date: Mar. 24, 2014

(87) PCT Pub. No.: WO2013/034181
PCT Pub. Date: Mar. 14, 2013

(65) Prior Publication Data
US 2014/0216924 A1    Aug. 7, 2014

(51) Int. Cl.
*C23C 14/34*    (2006.01)
*C23C 14/10*    (2006.01)
(Continued)

(52) U.S. Cl.
CPC ............. *C23C 14/10* (2013.01); *C23C 14/06* (2013.01); *C23C 14/0652* (2013.01);
(Continued)

(58) Field of Classification Search
CPC . C23C 14/3464; C23C 14/10; C23C 14/0652; C23C 14/06; C23C 14/08; H01J 37/3429; G02B 1/105
See application file for complete search history.

(56) References Cited

U.S. PATENT DOCUMENTS 5,180,476 A * 1/1993 Ishibashi .............. C23C 14/086
204/192.29
6,365,010 B1   4/2002 Hollars
(Continued)

FOREIGN PATENT DOCUMENTS

EP    1380857 A1   1/2004
FR    2939240 A1   6/2010
(Continued)

OTHER PUBLICATIONS

Machine Translation JP2004152727A.*
(Continued)

*Primary Examiner* — Michael Band
(74) *Attorney, Agent, or Firm* — Patterson + Sheridan LLP

(57) ABSTRACT

A process for manufacturing a transparent body for use in a touch panel is provided. The process includes: The process includes depositing a first transparent layer stack over a substrate with a first silicon-containing dielectric film, a second silicon-containing dielectric film, and a third silicon-containing dielectric film. The first and the third silicon-containing dielectric films have a low refractive index and the second silicon-containing dielectric film has a high refractive index. The process further includes depositing a transparent conductive film in a manner such that the first transparent layer stack and the transparent conductive film are disposed over the substrate in this order. At least one of the first silicon-containing dielectric film, the second silicon-containing dielectric film, the silicon-containing third dielectric film, or the transparent conductive film is deposited by sputtering from a target. Further thereto, a deposition apparatus (300) for manufacturing a transparent body for use in a touch panel and a transparent body for use in a touch panel are provided.

6 Claims, 9 Drawing Sheets

(51) Int. Cl.
  *C23C 14/06* (2006.01)
  *C23C 14/08* (2006.01)
  *H01J 37/34* (2006.01)
  *G02B 1/10* (2015.01)
  *G02B 1/16* (2015.01)

(52) U.S. Cl.
  CPC .......... *C23C 14/08* (2013.01); *C23C 14/3464* (2013.01); *G02B 1/105* (2013.01); *G02B 1/16* (2015.01); *H01J 37/3429* (2013.01); *G06F 2203/04103* (2013.01)

(56) References Cited

U.S. PATENT DOCUMENTS

| | | |
|---|---|---|
| 2002/0181109 A1 | 12/2002 | Chu |
| 2003/0100235 A1 | 5/2003 | Kittler |
| 2006/0159844 A1* | 7/2006 | Moriwaki ............. C23C 14/562 427/127 |
| 2009/0135151 A1 | 5/2009 | Sun |
| 2011/0232749 A1 | 9/2011 | Lienhart et al. |
| 2015/0062710 A1* | 3/2015 | Grillmayer ......... H01J 37/3405 359/585 |
| 2015/0109234 A1* | 4/2015 | Lotz ........................ H05K 3/00 345/174 |

FOREIGN PATENT DOCUMENTS

| | | | |
|---|---|---|---|
| JP | 63-265625 A | | 11/1988 |
| JP | 2003-136625 A | | 5/2003 |
| JP | 2003215309 A | | 7/2003 |
| JP | 2004152727 A | * | 5/2004 |
| JP | 2004-285412 A | | 10/2004 |
| JP | 2005-028821 A | | 2/2005 |
| JP | 2006-289901 A | | 10/2006 |
| JP | 2010-027567 | | 2/2010 |
| JP | 2010027567 A | * | 2/2010 |
| JP | 2010-064303 A | | 3/2010 |
| JP | 2010-182472 A | | 8/2010 |
| JP | 2011-134464 A | | 7/2011 |
| JP | 11-242102 A | | 12/2011 |
| KR | 20100092795 A | | 8/2010 |
| WO | 2004/095544 A2 | | 11/2004 |
| WO | 2007/003488 A1 | | 1/2007 |

OTHER PUBLICATIONS

International Search Report, PCT/EP2011/065478.
Korean Office Action for Application No. 10-2014-7009089 dated Apr. 18, 2017.

* cited by examiner

METHOD AND SYSTEM FOR MANUFACTURING A TRANSPARENT BODY FOR USE IN A TOUCH PANEL

TECHNICAL FIELD

Embodiments of the present disclosure relate to processes and systems for manufacturing a transparent body for use in a touch panel and a transparent body fabricated according to these processes.

BACKGROUND ART

Touch panels are a particular class of electronic visual displays, which are able to detect and locate a touch within a display area. Generally, touch panels include a transparent body disposed over a screen and configured to sense a touch. Such a body is substantially transparent, so that light in the visible spectrum emitted by the screen can be transmitted therethrough. At least some known touch panels include a transparent body constituted by a barrier and a transparent conductor formed, in this order, over a substrate. A touch on the display area of such a panel generally results in a measurable change of capacitance in a region of the transparent body. The change in capacitance may be measured using different technologies, so that the position of the touch can be determined.

A transparent body for use with a touch panel is subject to some particular requirements. In particular, one key requirement is that the transparent body is stable enough for withstanding multiple contacts on the screen and harsh conditions, so that reliability of the touch screen is not compromised over time. However, at least some known transparent bodies included in touch screens which are considered robust interfere with a proper transmission of light therethrough due to, for example, thickness, composition, and structure of the layers forming the transparent body. Furthermore, fabricating such a stable transparent body with high quality, for example with a uniform and defect-free barrier, is challenging.

Accordingly, it is desirable a process and an apparatus for forming a high-quality transparent body for use in a touch panel in a manner such that the body is stably formed over the substrate without compromising a proper transmission of light in the visible spectrum.

Further, a common manufacturing process for touch panel applications can be a sputtering process, wherein a touch panel coating is deposited on a plastic film using roll-to-roll sputter web coater. There are several types of touch panel coatings on the market. Typically, when changing from one touch panel process to the next process a change of sputter target(s) or cathode(s) is conducted. Thereby, the machine is vented and opened. The sputter target(s) are removed and replaced by a different target material. This procedure is time consuming and can create failures (e.g. a water leak). Accordingly, there is a further desire to improve the cost of ownership for the operator of a touch panel manufacturing system and provide additional value.

SUMMARY OF THE INVENTION

According to one embodiment, a process for manufacturing a transparent body for use in a touch panel is provided. The process includes depositing a first transparent layer stack over a substrate with a first silicon-containing dielectric film, a second silicon-containing dielectric film, and a third silicon-containing dielectric film. The first and the third silicon-containing dielectric films have a low refractive index and the second silicon-containing dielectric film has a high refractive index. The process further includes depositing a transparent conductive film in a manner such that the first transparent layer stack and the transparent conductive film are disposed over the substrate in this order. At least one of the first silicon-containing dielectric film, the second silicon-containing dielectric film, the silicon-containing third dielectric film, or the transparent conductive film is deposited by sputtering from a target.

According to another embodiment, a deposition apparatus for manufacturing a transparent body for use in a touch panel is provided. The apparatus includes: a first deposition assembly configured to deposit a first transparent layer stack over a substrate, the first transparent layer stack including a first silicon-containing dielectric film, a second silicon-containing dielectric film, and a third silicon-containing dielectric film, the first and the third silicon-containing dielectric films having a low refractive index and the second silicon-containing dielectric film having a high refractive index; and a second deposition assembly configured to deposit a transparent conductive film. The first deposition assembly and the second deposition assembly are arranged such that the first transparent layer stack and the transparent conductive film are disposed over the substrate in this order. At least one of the first deposition assembly or the second deposition assembly includes a sputtering system operatively coupled to a target, e.g. a rotatable target. The sputtering system is configured to deposit at least one of the first silicon-containing dielectric film, the second silicon-containing dielectric film, the third silicon-containing dielectric film, or the transparent conductive film by sputtering by the target.

Surprisingly, the combination of dielectric films deposited according to embodiments of the present disclosure having additional dielectric films in comparison to at least some known transparent bodies for use in a touch panel, with a characteristic combination of refractive indexes, and in which at least one of the films is deposited by sputtering by a target, facilitates manufacturing of a high-quality transparent body that not only yields proper transmission of light but also yields stable performance over time. In addition, the combination silicon-containing sputtering targets, which are provided for the silicon-containing dielectric films, allow for a variety of layer stacks, including different types of stacks including three silicon-containing dielectric layers, stacks including two silicon-containing dielectric layers, or stacks including one silicon-containing layer. Accordingly, an operator of a web coater for touch panel precursors can switch between different types of touch panels. This can for example be done between different rolls of flexible substrates (webs) or even on different portions of one roll of flexible substrate. Thus, the time to change between different processes is reduced and, thereby, the cost of ownership and/or additional value (e.g. flexibility) for the ownership can be provided.

Further aspects, advantages, and features of the present invention are apparent from the dependent claims, the description, and the accompanying drawings.

Embodiments are also directed to apparatuses for carrying out the disclosed processes and including apparatus parts for performing described process steps. Furthermore, embodiments are also directed to methods by which the described apparatus operates or by which the described apparatus is manufactured. The methods may include method steps for carrying out functions of the apparatus or manufacturing parts of the apparatus. The method steps may be performed by way of hardware components, firmware, software, a computer programmed by appropriate software, by any combination thereof or in any other manner.

BRIEF DESCRIPTION OF THE DRAWINGS

A full and enabling disclosure, including the best mode thereof, to one of ordinary skill in the art, is set forth more particularly in the remainder of the specification, including reference to the accompanying figures, wherein.

DETAILED DESCRIPTION OF THE INVENTION

Reference will now be made in detail to the various embodiments, one ore more examples of which are illustrated in the figures. Each example is provided by way of explanation, and is not meant as a limitation of the invention. It is contemplated that elements of one embodiment may be advantageously utilized in other embodiments without further recitation.

The embodiments described herein include a process for manufacturing a transparent body for use in a touch panel. In particular, embodiments of the present disclosure include a transparent body including a first transparent stack configured to constitute a barrier in a touch panel and a transparent conductive film configured to constitute a transparent conductor in a touch panel. Thereby, a transparent body according to embodiments herein facilitates touch sensing when implemented in a touch panel.

Figure 1:
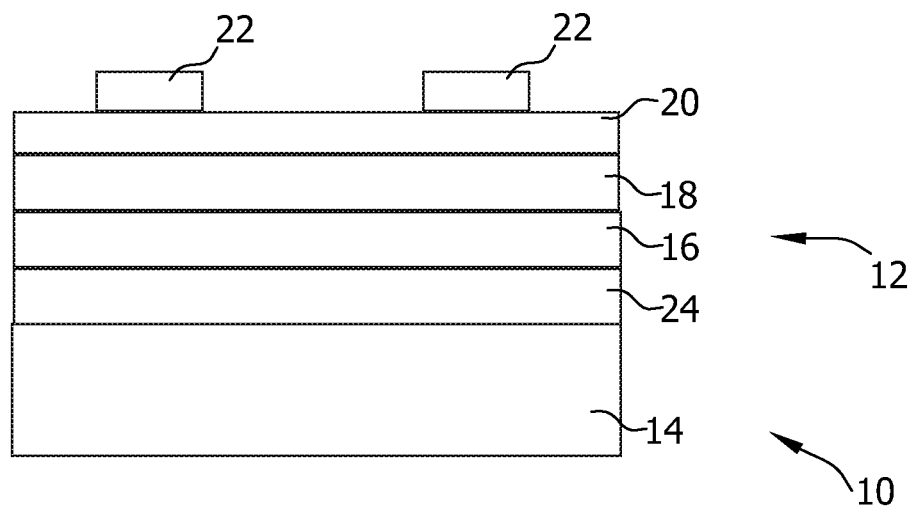
FIG. 1 is a schematic representation of an exemplary transparent body for use in a touch panel in accordance with embodiments herein.

According to embodiments herein, a first transparent layer stack 12, as depicted in FIG. 1, is deposited over a substrate 14. The term "substrate" as used herein shall embrace both inflexible substrates, e.g., a wafer or a glass plate, and flexible substrates such as a web or a foil. The term "transparent" as used herein shall particularly include the capability of a structure to transmit light with relatively low scattering, so that, for example, light transmitted therethrough can be seen in a substantially clearly manner. In the case of a flexible substrate, it is typical that substrate 14 has a hardcoat 24 formed thereon.

According to typical embodiments, a layer stack is constituted by a number of films formed (e.g., by deposition) one atop another. In particular, embodiments herein include depositing a first transparent layer stack which may be constituted by a plurality of dielectric films, that is, films that, substantially, do not conduct electricity. In particular, first transparent layer stack 12 may include a first silicon-containing dielectric film 16, a second silicon-containing dielectric film 18, and a silicon-containing third dielectric film 20, as exemplarily depicted in FIG. 1. Thereby, the first transparent layer stack may constitute a barrier for use in a touch panel. According to typical embodiments, first silicon-containing dielectric film 16, second silicon-containing dielectric film 18, and third silicon-containing dielectric film 20 are deposited one atop each other in this order.

According to yet further typical embodiments, the first silicon-containing dielectric film 16 can be an $SiO_2$ layer with at least 90 weight-% of $SiO_2$, the second silicon-containing dielectric film 18 can be an $Si_3N_4$ layer with at least 70 weight-%, typically at least 90 weight-% of $S_3N_4$, and the third silicon-containing dielectric film 20 can be an $SiO_2$ layer with at least 90 weight-% of $SiO_2$. Thereby, either a layer structure for high transparency or a layer structure with improved transmission characteristics, as described below, can be provided.

Thereby, at least three silicon sputter target assemblies, typically MF twin targets, are used. The different layers and different layer properties are generated by the processing gases, e.g. by using an argon- and oxygen-containing gas mixture or by using an argon- and nitrogen-containing gas mixture. Accordingly, the three silicon target assemblies, typically having sprayed silicon targets, can be used for using two different three-layer stacks by utilizing different processing gases and/or deposition parameters.

According to yet further optional modifications in the process, only a first silicon-containing dielectric film can be deposited as an $SiO_2$ layer with at least 90 weight-% of $SiO_2$ or a first silicon-containing dielectric film can be deposited as an $Si_3N_4$ layer with at least 70 weight-%, typically at least 90 weight-% of $S_3N_4$ a second silicon-containing dielectric film can be deposited as an $SiO_2$ layer with at least 90 weight-% of $SiO_2$. As described above, at least four different types of transparent layer stacks for touch panels can be manufactured with the described target assemblies. Further, methods can include deposition of a transparent layer stack of a first type and subsequent deposition of a transparent layer stack of one or more of the further types, e.g. types 2, 3 or 4. The switching between the different transparent layer stacks can be conducted based upon modifications of processing gases, layer thicknesses (see, e.g. description of FIG. 11 below) and process parameters and while sputtering the same Si target assemblies. Thus, a universal touch panel sputter coater with small effort for changing between different touch panel products can be provided.

The above-described switching capability can be described as maintaining a technical vacuum between the manufacturing of a first type of a transparent layer stack and a further, different type of a transparent layer stack. This is due to the fact that the deposition apparatus does not need to be opened in order to exchange the targets, i.e. the sputtering cathodes. Maintaining the vacuum is also beneficial in the sense that venting and pumping down of the system is also time consuming. However, maintaining of a vacuum is mainly to be understood as not exchanging a target or cathode.

According to embodiments described herein, wherein a three-layer transparent layer stack is deposited the first and the third silicon-containing dielectric films have a low refractive index and the second silicon-containing dielectric film has a high refractive index.

More specifically, according to embodiments herein, the first and the third silicon-containing dielectric films, e.g. consisting of SiO2 have a lower refractive index than the second silicon-containing dielectric film, e.g. consisting of Si3N4. A first transparent layer stack of a transparent body, e.g. a three-layer-type stack, manufactured according to embodiments herein provides, in view of the additional dielectric films in comparison to at least some known transparent bodies for use in a touch panel and the characteristic combination of films with different refractive indexes, a barrier that facilitates a proper transmission of light through the transparent body.

As used herein, a low refractive index is a refractive index sufficiently low for enabling a particular transparent body to transmit light in a manner adequate for a particular application thereof. As used herein, a high refractive index is a refractive index sufficiently high for enabling a particular transparent body to transmit light in a manner adequate for a particular application thereof According to certain embodiments, a low refractive index is a refractive index lower than 1.50. According to certain embodiments, a high refractive index is a refractive index of at least 1.80. In general, the refractive indexes of the dielectric films of the first transparent layer stack are chosen in a manner such that light is transmitted through the transparent body according to embodiments of the present disclosure. For example, the first and the third dielectric films may have a refractive index lower than 1.50 or, more specifically, 1.47 or, even more specifically, 1.45, and the second dielectric films may have a refractive index of at least 1.80 or, more specifically, 2.10, or, even more specifically, 2.40. The values of the refractive index listed in the present disclosure refer to refraction of green light at a wavelength of 515 nm.

According to embodiments described herein, transparent body 10 includes a transparent conductive film 22, such as, but not limited to, indium tin oxide (ITO), in particular, crystalline ITO or ITO with a sheet resistance of 400 Ohm/square. According to different embodiments, which can be combined with other embodiments described herein, typically, ITO with composition 97% In2O3 and 3% SnO2 for crystalline ITO and/or ITO with composition 90% In2O3 and 10% SnO2 for non-crystalline ITO can be used. Particularly as ITO deposition is typically a DC sputtering deposition, a target assembly with two targets (e.g. two rotatable targets), can be equipped with an ITO target for crystalline ITO and with an ITO target for non-crystalline ITO. This does further improve the flexibility of the deposition apparatus and a customer can vary the type of the transparent conductive oxide film on the fly. That is, this configuration allows to further switch between non-crystalline and crystalline ITO by using either one of the cathodes.

According to typical embodiments, as exemplarily depicted in FIG. 1, deposition is performed in a manner such that a first transparent layer stack 12 and transparent conductive film 22 are disposed over a substrate 14 in this order for forming a transparent body. That is, the first transparent layer stack may be formed over the substrate with the conductive film being formed thereon.

FIG. 1 shows a structured (e.g., by patterning) transparent conductive film 22. It should be noted that embodiments herein also includes a non-structured (e.g., a non-patterned or substantially uniform film) transparent conductive film 22. In typical embodiments, due to the structure of the transparent layer stack, it is facilitated that the conductive film does not prejudice an optimal transmission of light through the body. In particular, a transparent layer stack according to embodiments herein facilitates that a conductive film, even a structured conductive film, does not affect the neutrality of the reflectance color, as further discussed below.

According to typical embodiments, deposition is performed by sputtering of one or more rotatable targets. More specifically, according to embodiments herein, at least one of the films referred to above is deposited by sputtering from a rotatable target, so that formation of a stable transparent body and with a high quality is facilitated. For example, according to embodiments herein, a film may be deposited having a higher uniformity, and with a low density of defects and contamination particles. Thereby, it is facilitated manufacturing of a high-quality transparent body that not only yields a proper transmission of light but also yields a stable performance over time. Furthermore, a manufacturing process including sputtering of one or more rotatable targets may further facilitate a higher manufacturing rate and the production of a lower number of contaminant particles as compared to other deposition methods.

Thereby, according to typical embodiments, sputtering from a silicon target, e.g. a sprayed silicon target, is conducted by MF sputtering, that is middle frequency sputtering. According to embodiments herein, middle frequency is a frequency in the range 5 kHz to 100 kHz, for example, 10 kHz to 50 kHz. Sputtering from a target for a transparent conductive oxide film is typically conducted as DC sputtering.

As compared to other "invisible" touch panel transparent layer stacks, another advantage of the use of silicon-containing layers is that the target price of sprayed Si compared to the target price of the high index material Niobium Oxide (Nb2O5) is reduced. Further, the above-described use of rotatable targets increases the target lifetime and there is less target exchange time necessary compared to an arrangement with planar targets. Further, the quality of the coating is improved since there is less particle creation from a rotatable cathode compared to a planar cathode. Accordingly, having at least three sprayed silicon rotatable target assemblies allows for full flexibility in the choice of the transparent layer stack for touch panel applications, including three-layer-stacks, two-layer stacks and one-layer stacks, and improves costs of ownership.

According to certain embodiments, manufacturing of transparent body 10 further includes patterning of transparent conductive film 22. Thereby, formation of a transparent body for a touch panel implementing projected capacitive touch is facilitated.

However, a patterned transparent conductive film 22 may further compromise the proper transmission of light through a transparent body for use in a touch panel. For example, at least some known transparent bodies for use in a touch panel are coated with two layers: a $SiO_2$ layer (forming the barrier) and a transparent ITO layer (forming the transparent conductor, i.e., an electro-conductive coating). In some cases, the transparent ITO layer is partly removed by etching.

Thereby, the optical properties, in particular the reflectance and transmittance, are modified in comparison to the transparent body with the unmodified deposited ITO layer. In particular, the reflectance/transmittance of the $SiO_2$/ITO layer is different from the reflectance/transmittance of the SiO2 layer. The resulting contrast/color difference (e.g., b* value as defined by the International Commission on Illumination (CIE) in 1976) may be visible and may be annoying to the user. This effect is exemplified in FIG. 4.

Figure 4:
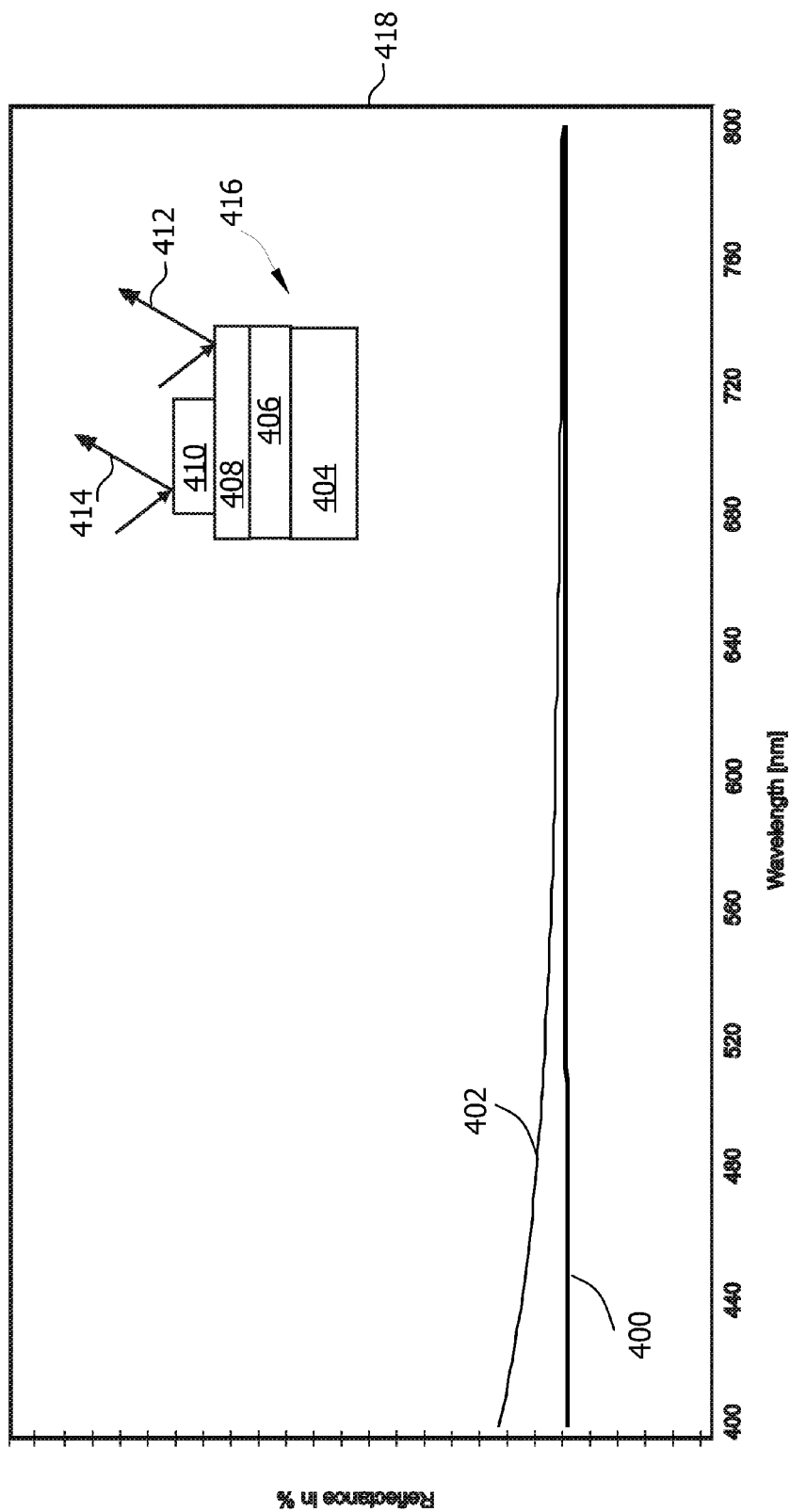
FIG. 4 is a graph illustrating the reflectance of a known transparent body for use in a touch panel.

FIG. 4 shows a graph 418 illustrating the reflectance of a known transparent body 416 for use in a touch panel in a reflectance range between 0% and about 50%. Known transparent body 416 includes a PET substrate 404, a hardcoat 406 formed on PET substrate 404, a silicon oxide film 408 formed on hardcoat 406 and a patterned ITO film 410 formed on silicon oxide film 408. ITO film 410 may have a typical thickness of 15 nm and a 400 Ohm/square sheet resistance. Silicon oxide film 408 may have a typical thickness of 15 nm. In FIG. 4 it is further illustrated a reflected light 412 on silicon oxide film 408 and a reflected light 414 on patterned ITO film 410. Graph 418 illustrates a calculated reflectance of silicon oxide and patterned ITO on a hardcoated PET film. In particular, graph 418 includes the reflectance on silicon oxide 400 (corresponding to reflected light 412 on silicon oxide film 408) and the reflectance on silicon oxide and ITO 402 (corresponding to reflected light 414 on patterned ITO film 410).

From graph 418 it can be understood that there is an increase of reflectance for reflected light 414 on patterned ITO film 410 from 660 to 400 nm, which creates a slight "blue" reflection in comparison to the substantially neutral (i.e., constant) reflectance of reflected light 412 on silicon oxide film 408. This increase of reflection corresponds to a decrease of transmittance of patterned ITO film 410, so that the ITO patterned regions acquire a slightly yellow appearance. In contrast, thereto, the reflectance/transmittance color of silicon oxide film 408 is substantially neutral. That is, the patterned conductive layer becomes "visible." However, it would be desirable to minimize this difference of reflectance/transmittance between patterned ITO film 410 and silicon oxide film 408. In other words, it would be desirable to design a transparent body in which the conductive layer is invisible without compromising stability and quality of the transparent body.

By the combination of dielectric films deposited according to embodiments of the present disclosure, in which at least one of the films is deposited by sputtering by a rotatable target, color neutrality of the transparent body, even when including a patterned conductive layer is facilitated. That is, using two additional layers in the barrier typically facilitate a significant reduction of the contrast between areas of the transparent body where the transparent conductive film is the top layer and areas where the dielectric film is the top layer. In other words, a transparent body manufactured according to embodiments herein facilitates rendering a contrast/color difference "invisible".

As described above, manufacturing of a SiO2/Si3N4/SiO2 transparent layer stack results in improved transparency and/or contrast/color characteristics. Yet, a Si3N4/SiO2 transparent layer stack or a SiO2 transparent layer stack results in reduced costs, which might be the preferred choice for touch panels where lower quality is sufficient. The methods and apparatuses described herein, allow for switching between the more sophisticated transparent dielectric layer stacks and the less cost-incurring layer stacks without exchange of targets, i.e. while maintaining vacuum when switching between the processes.

Figure 5:
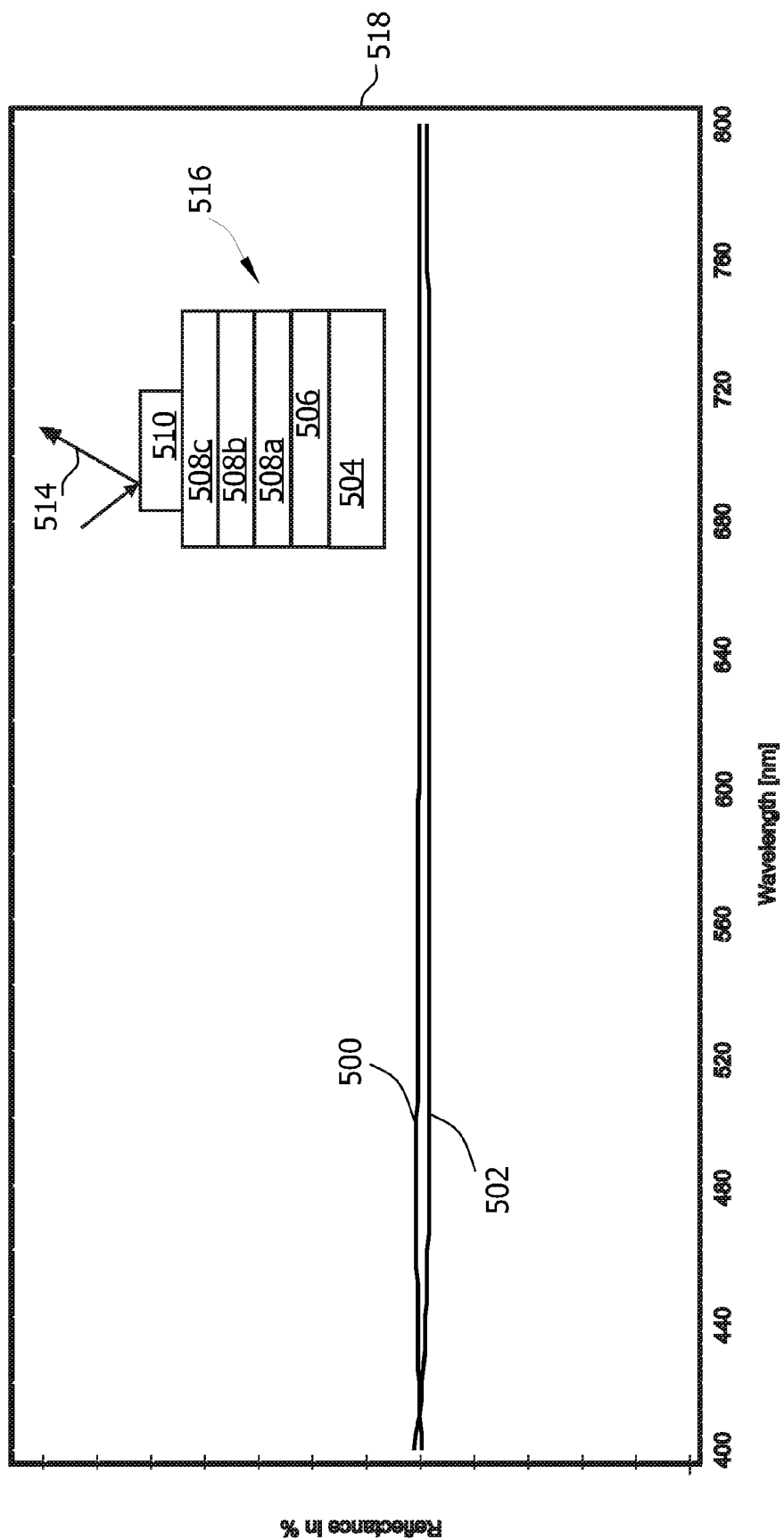
FIG. 5 is a graph illustrating the reflectance of an exemplary transparent body for use in a touch panel in accordance with embodiments herein.

FIG. 5 shows a graph 518 illustrating the reflectance on silicon oxide 500 of a transparent body 516 according to embodiments of the present disclosure and in a reflectance range between 0% and about 25%. Exemplary transparent body 516 includes a PET substrate 504, a hardcoat 506 formed on PET substrate 504, a silicon oxide (e.g., $SiO_2$) film 508a formed on hardcoat 506, a silicon nitride film 508b formed on silicon oxide film 508a, a silicon oxide (e.g., $SiO_2$) film 508c formed on film 508b, and a patterned ITO film 510 formed on silicon oxide film 508c (silicon oxide film 508a having a thickness of 15 nm, silicon nitride film 508b having a thickness of 15 nm, silicon oxide film 508c having a thickness between 40 and 60 nm, and patterned ITO film 510 having a thickness of 15 nm).

FIG. 5 further illustrates a reflected light 514 on patterned ITO film 510. That is, graph 518 illustrates a calculated reflectance of a layer stack which may consist of a $SiO_2$—$Si3N4$-$SiO_2$ structure on a hardcoated PET in comparison with a layer stack which may consist of a $SiO_2$—$TiO_2$—$SiO_2$—ITO structure, the ITO being patterned. In particular, graph 518 includes the reflectance on silicon oxide 500 (corresponding to reflected light on a transparent body, such as transparent body 516, without patterned ITO film 510) and the reflectance on silicon oxide and ITO 502 (corresponding to reflected light 514 on patterned ITO film 510).

From graph 518, it can be understood that the reflectance curves are almost identical, so that there is substantially no visual difference between the etched and non-etched parts of the conductive film. That is, the reflectance of the transparent body with an integral conductive layer, in this case ITO, is almost identical to that of a transparent body with a patterned conductive layer (e.g., partly removed by an etching process). The transmittance (not shown) evidences a corresponding behavior. In contrast to the reflectance of at least some known transparent bodies for touch panels, such as the $SiO_2$—ITO structure in FIG. 4, the reflection/transmission color of transparent body 516 is substantially neutral (i.e. with a b* value near 0). It should be noted that, surprisingly, graph 518 evidences a slightly increased transmittance of a transparent body with two additional films in respect to at least some known transparent bodies for use in a touch panel.

Figure 6:
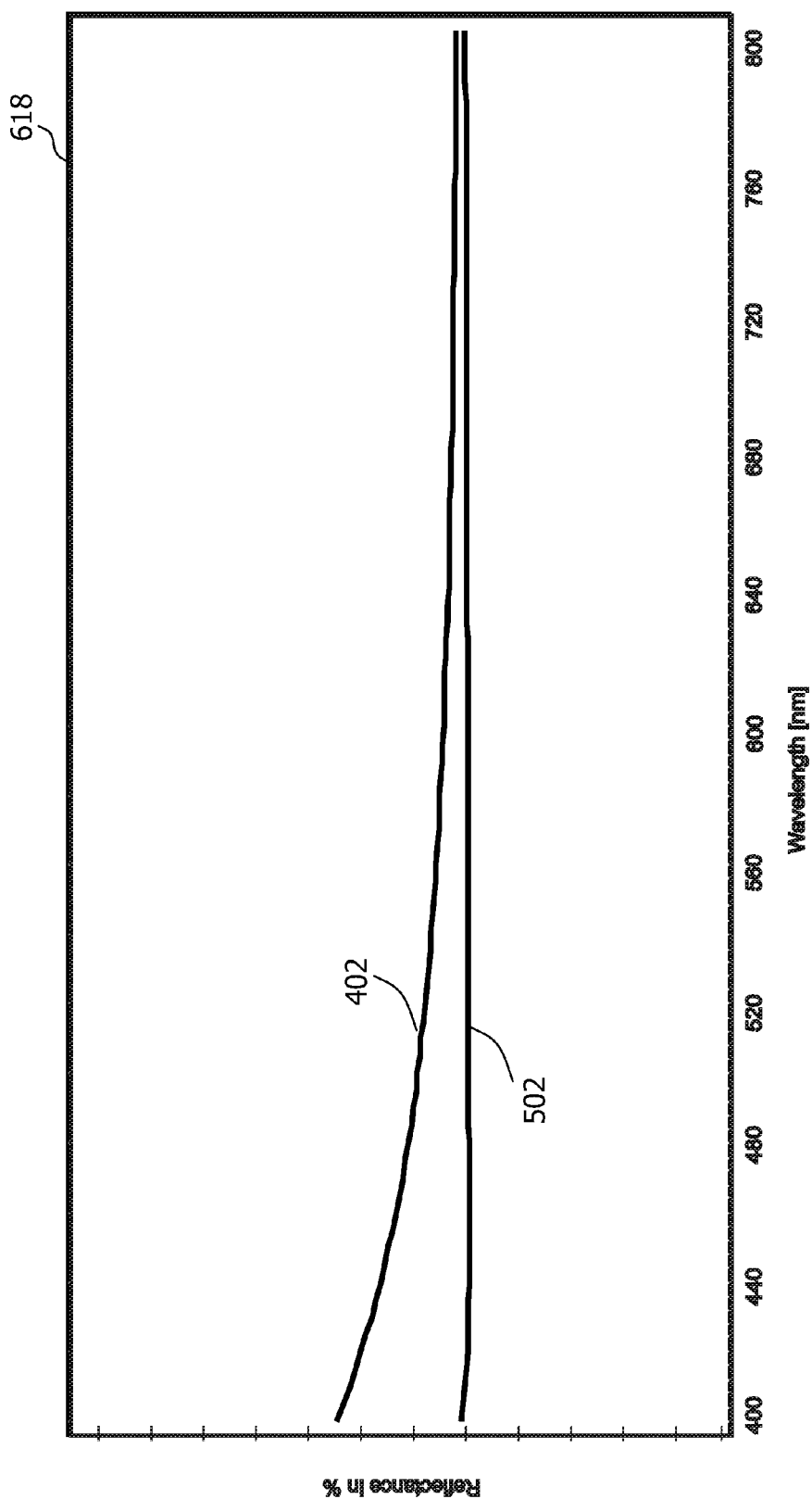
FIG. 6 is a graph with a direct comparison of reflectances shown in FIGS. 4 and 5.

FIG. 6 shows a graph 618 directly comparing reflectance on silicon oxide and ITO 402 from FIG. 4 and reflectance on silicon oxide and ITO 502 from FIG. 5 in a reflectance range between 0% and about 24%. From this figure, it can be further understood that, compared to a "two-layer" system, a "four-layer" system according to embodiments herein facilitates that the reflection on the transparent body is not increased in the blue region of the visible spectrum. That is, a transparent body manufactured according to embodiments herein typically facilitates improved color neutrality.

Accordingly, having at least three sprayed silicon rotatable target assemblies allows for full flexibility in the choice of the transparent layer stack for touch panel applications, including three-layer-stacks, two-layer stacks and one-layer stacks, and improves costs of ownership.

According to certain embodiments, the first transparent layer stack and the transparent conductive film are deposited in a manner such that the b* value for the manufactured transparent body is below 1.5 or, in particular 1, or more specifically, 0.7, or, even more specifically, 0.2. In particular, according to embodiments herein, the b* value for the structure formed solely by the first transparent layer stack and the transparent conductive film and placed above a substantially transparent substrate may adopt these values.

According to certain embodiments, the thickness and/or the refractive indexes of the films included in the first transparent layer stack and the transparent conductive film may be chosen in a manner such that the b* value for the manufactured transparent body is below 1.5 or, in particular 1, or more specifically, 0.7, or, even more specifically, 0.2. Thickness values for the films in an exemplary transparent body are discussed below. It should be noted that, in particular, for a different thickness or composition of the transparent conductive film, it may be necessary to correspondingly adapt the thickness of the other films in the transparent body in order to achieve a particular b* value.

Figure 7:
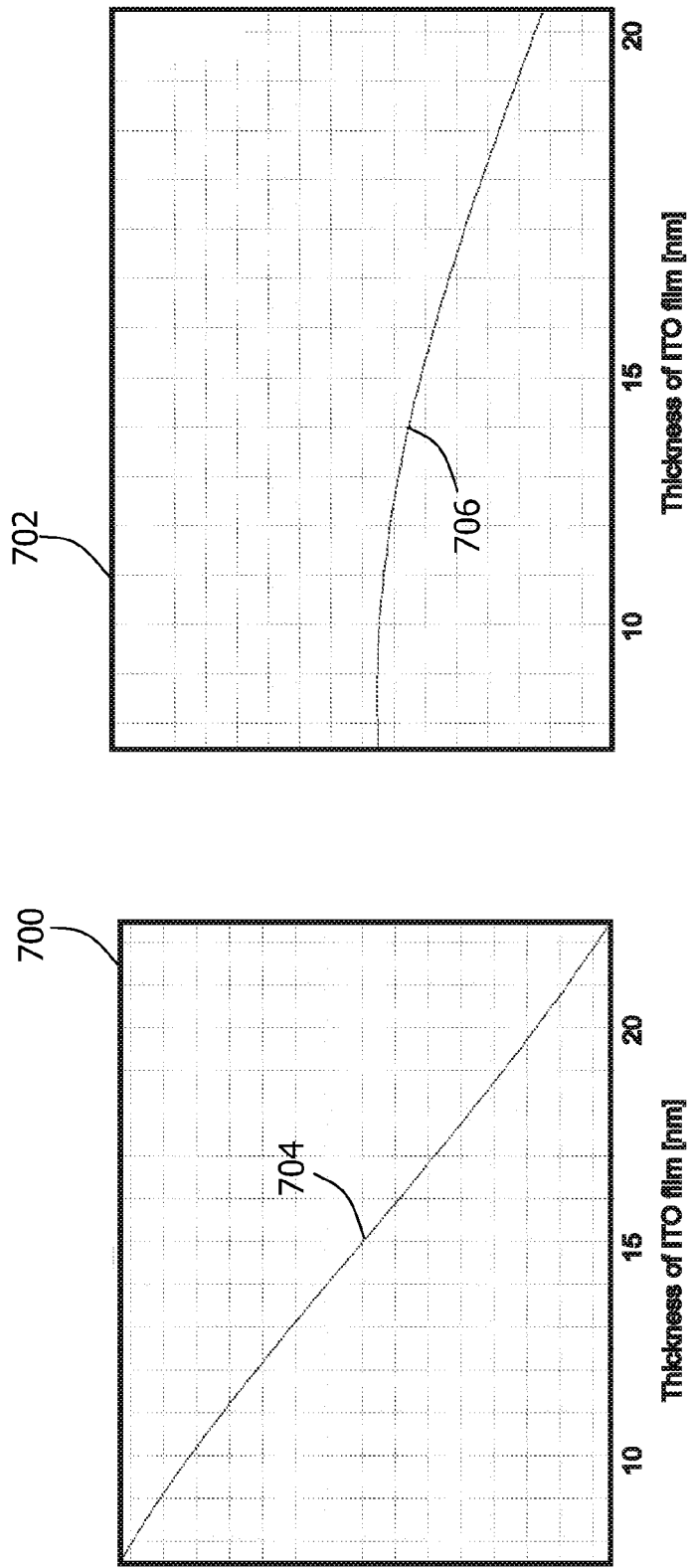
FIG. 7 shows graphs illustrating b* values of a transparent body with the structure of the know transparent body of FIG. 4 and a transparent body with the structure of the exemplary transparent body of FIG. 5.

FIG. 7 shows two graphs 700, 702 which illustrate b* values 704 of a transparent body in a range from −7.5 and −1.5 with a similar structure to the know transparent body of FIG. 4 (graph 700) and b* values 706 in a range from −2.5 to 5 of a transparent body with a similar structure to the exemplary transparent body of FIG. 5 (graph 702) for different thicknesses of patterned ITO film 410 and patterned ITO film 510. From FIG. 7 it can be appreciated that the color of the known "2-layer" transparent body 416 of FIG. 4 has a calculated b* value (reflectance) of approximately −4.5. In contrast thereto, exemplary transparent body 516, deposited according to embodiments herein, has a b* value close to zero.

Additionally, a comparison between graph 700 and graph 702 shows that a transparent body deposited according to embodiments herein facilitates a significantly reduced sensitivity of the b* value to a variation in the thickness of the conductive film (in the example, patterned ITO film 510) compared to the "2-layer" structure of at least some known transparent bodies. Therefore, a transparent body deposited according to embodiments herein facilitates a better control of the optical properties of the body, such as the b* value, in particular, in view of possible variations of manufacturing parameters, such as the thickness of the conductive layer.

Figure 8:
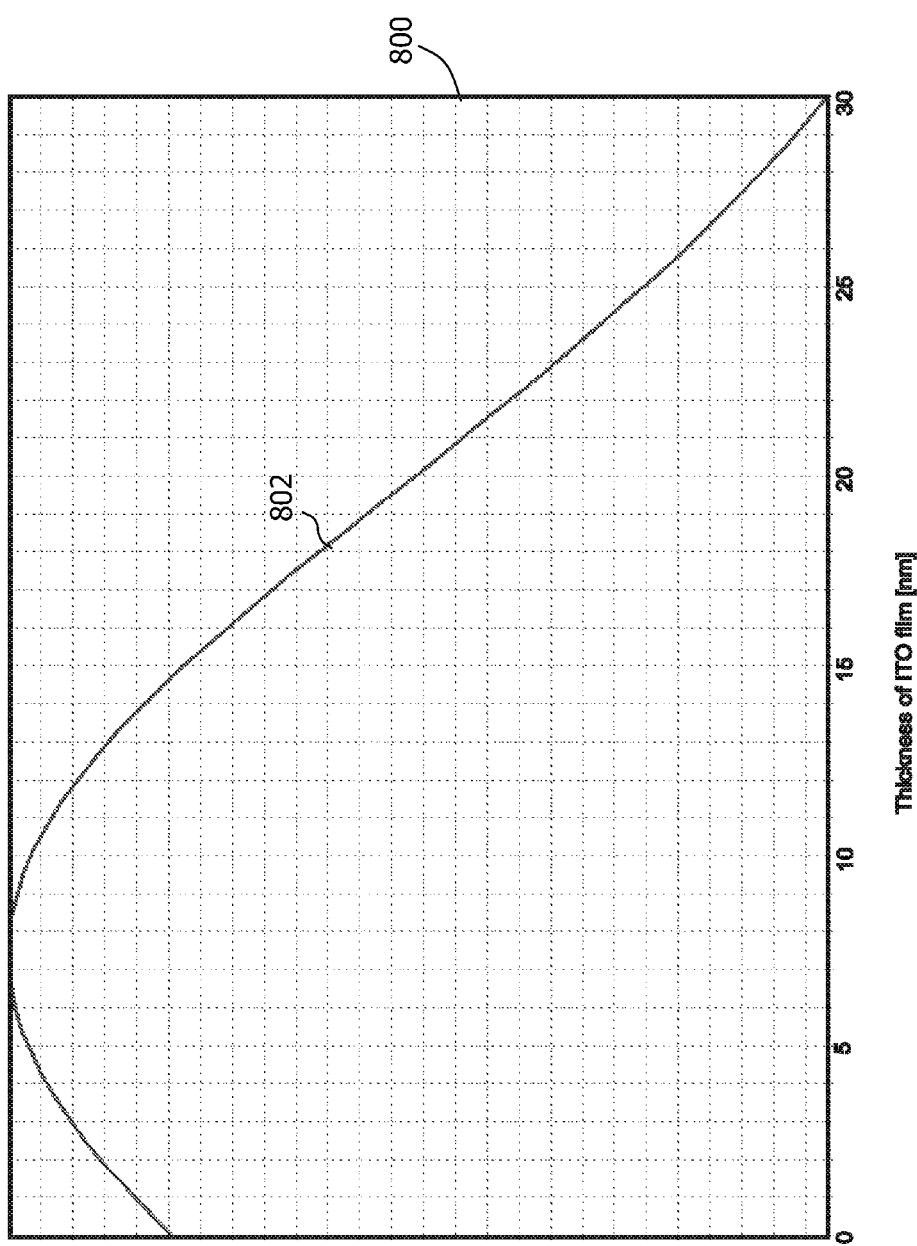
FIG. 8 shows a graph illustrating b* values of a transparent body with the structure of the exemplary transparent body of FIG. 5.

FIG. 8 shows a graph 800 illustrating b* values 802 in a range from −10 to 2.5 of a transparent body with the structure of the exemplary transparent body of FIG. 5. From graph 800 it can be further understood that exemplary transparent body 516, i.e., a transparent body deposited according to embodiments herein with an ITO layer thickness of 15 nm, has a substantially neutral reflectance with and without conductive film thereon. Therefore, a transparent body deposited to at least some of the embodiments herein facilitates the manufacturing of a transparent body for use in a touch panel with a substantially neutral reflectance color without compromising stability of the manufactured films.

Figure 9:
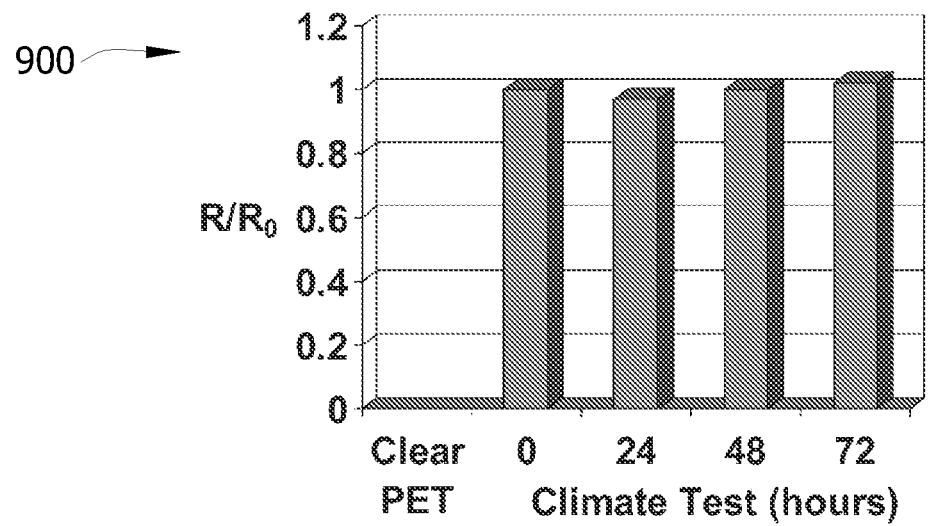
FIG. 9 shows different graphs evidencing stable performance of a transparent body manufactured according to embodiments herein.
Figure 9:
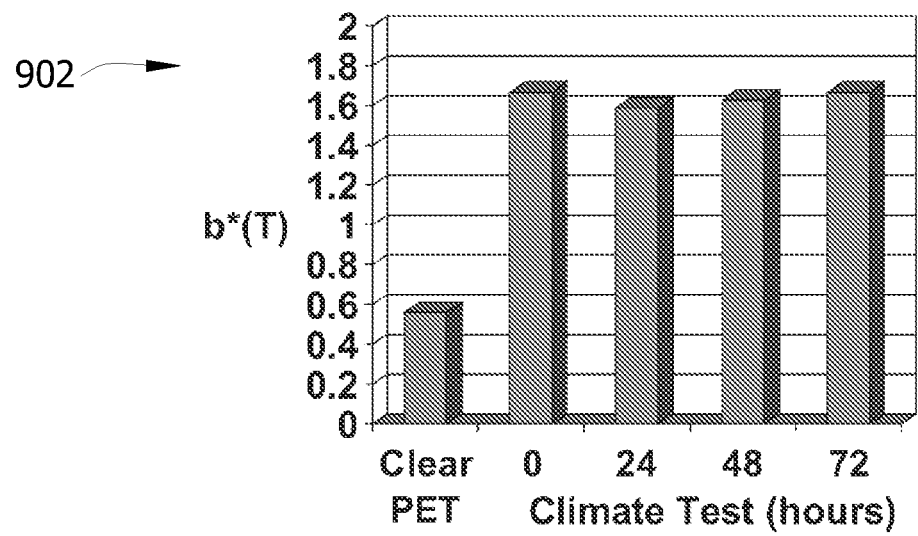

Embodiments of the present disclosure provide a manufacturing process, which not only yields a proper transmission of light but also yields a stable performance over time as evidenced by FIG. 9. In particular, FIG. 9 shows two graphs 900, 902 evidencing stable performance of a transparent body manufactured according to embodiments herein.

Graph 900 shows variation of the ratio (R/R0) between resistance of an ITO film forming part of a transparent body according to embodiments herein before a climate test (R) and resistance of the ITO film after the climate test (R0). From graph 900, it can be understood that a transparent body manufactured according to embodiments herein facilitates a stable resistance of the conductive film over time, even under harsh climate conditions. Graph 902 shows variation of b* values with time during a climate test. From graph 902 it can be understood that a transparent body manufactured according to embodiments herein facilitates a stable b* value over time, even under harsh climate conditions.

Therefore, a transparent body manufactured according to embodiments herein facilitates proper and stable optical performance of a touch panel, even under harsh conditions.

Figure 2:
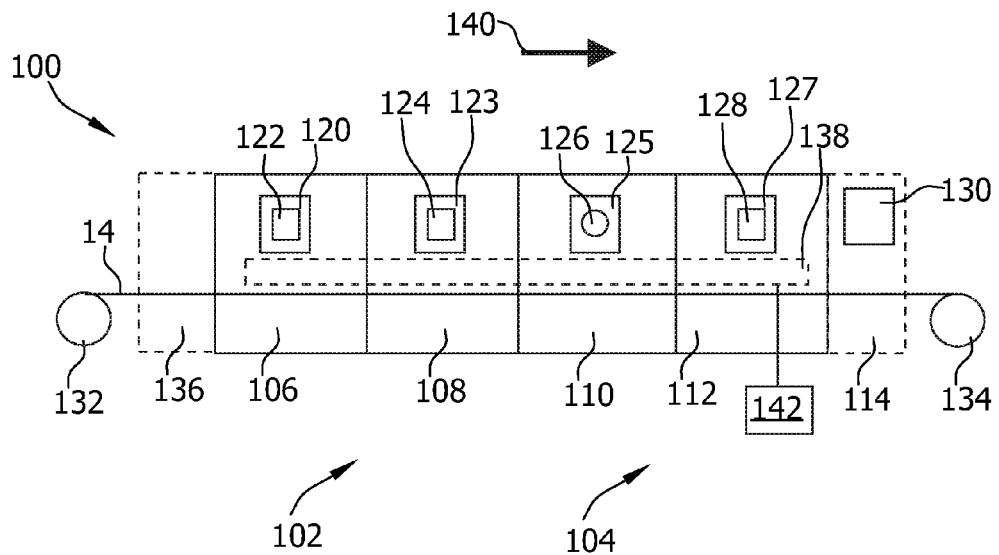
FIG. 2 is a schematic representation of an exemplary deposition apparatus for manufacturing of a transparent body for use in a touch panel in accordance with embodiments herein.

FIG. 2 schematically illustrates an example of a deposition apparatus 100 for manufacturing a transparent body for use in a touch panel according to embodiments herein. The exemplarily apparatus includes a first deposition assembly 102 configured to deposit a first transparent layer stack 12 over a substrate 14, the first transparent layer stack 12 including a first silicon-containing dielectric film 16, a second silicon-containing dielectric film 18 and a third silicon-containing dielectric film 20. According to typical embodiments, each film of layer stack 12 is deposited in an individual deposition chamber or individual compartments of a deposition chamber. In particular, exemplary deposition apparatus 100 includes a first silicon-containing dielectric film deposition chamber 106 configured to deposit first silicon-containing dielectric film 16, a second silicon-containing dielectric film deposition chamber 108 configured to deposit second silicon-containing dielectric film 18, and a third silicon-containing dielectric film deposition chamber 110 configured to deposit third silicon-containing dielectric film 20. The exemplary deposition apparatus 100 also includes a second deposition assembly 104 configured to deposit a transparent conductive film 22. In particular, exemplary deposition apparatus 100 includes a conductive film deposition chamber 112 configured to deposit transparent conductive film 22.

According to embodiments herein, first deposition assembly 102 and second deposition assembly 104 are arranged such that first transparent layer stack 12 and transparent conductive film 22 are disposed over substrate 14 in this order. In the exemplary embodiment, substrate 14 is conveyed through the chamber by a conveyor system (not shown) along a deposition path in a deposition direction 140. In the exemplary embodiment, first deposition assembly 102 is arranged upstream relative to second deposition assembly 104, so that transparent conductive film 22 is deposited over first transparent stack 12.

According to typical embodiments, deposition apparatus 100 is configured to deposit the first and the third dielectric films having a low refractive index and the second dielectric film having a high refractive index. Thereby, however, the first, second and third deposition chambers are provided with silicon sputter targets such that the chambers can serve for multiple purposes and a apparatus 100 provided improved flexibility for switching between different types of transparent layer stacks of one, two, three, or more dielectric films for touch panel applications.

According to typical embodiments, first deposition assembly 102 is configured to deposit first dielectric film 16, second dielectric film 18, and third dielectric film 20 over the substrate in this order. In the exemplary embodiment, first dielectric film deposition chamber 106, second dielectric film deposition chamber 108, and third dielectric film deposition chamber 110 are disposed in this order along the deposition path, so that, first dielectric film 16, second dielectric film 18, and third dielectric film 20 are deposited over substrate 14 in this order and, in particular, one atop another.

The deposition chambers may include any suitable structure, configuration, arrangement, and/or components that enable deposition apparatus 100 to deposit a transparent body according to embodiments of the present disclosure. For example, but not limited to, the deposition chambers may include suitable deposition systems including coating sources, power sources, individual pressure controls, deposition control systems, and temperature control.

According to typical embodiments, the chambers are provided with individual gas supplies. Thereby, different silicon-containing layers can be deposited by change of the processing gases in one of the chambers. The chambers are typically separated from each other for providing a good gas separation. For example, the deposition chambers may be separated from each other in a manner such that the ratio of gases expanding from other chambers into a particular chamber to gas directly supplied to the particular chamber is of at least 1 to 100. A deposition apparatus 100 according to embodiments herein is not limited in the number of deposition chambers. For example, but not limited to, deposition apparatus 100 may include 3, 5, 6, or 12 deposition chambers.

According to typical embodiments, any of the film deposition chambers of deposition apparatus 100 may be configured for performing deposition by sputtering, such as magnetron sputtering, typically from rotatable targets. In particular, first deposition assembly 102 may be configured for depositing first transparent stack 12 by magnetron sputtering and/or second deposition assembly 104 may be configured for performing deposition by magnetron sputtering.

As used herein, "magnetron sputtering" refers to sputtering performed using a magnet assembly, that is, a unit capable of a generating a magnetic field. Typically, such a magnet assembly consists of a permanent magnet. This permanent magnet is typically arranged within a rotatable target or coupled to a planar target in a manner such that the free electrons are trapped within the generated magnetic field generated below the rotatable target surface. Such a magnet assembly may also be arranged coupled to a planar cathode.

Magnetron sputtering may also be realized by a double magnetron cathode, such as, but not limited to, a Twin-Mag™ cathode assembly. Particularly, for MF sputtering from a silicon target, target assemblies including double cathodes can be applied. According to typical embodiments, the cathodes in a deposition chamber may be interchangeable. However, as described above, the embodiments of the present invention allow for switching between types of transparent layer stacks for touch panels without the necessity to change targets. Accordingly, the targets are changed after the silicon has been consumed.

According to certain embodiments, one or some of the chambers may be configured for performing sputtering without a magnetron assembly. One or some chambers, for example additional chamber, may be configured for performing deposition by other methods, such as, but not limited to, chemical vapor deposition or pulsed laser deposition.

According to typical embodiments, at least one of first deposition assembly 102 or second deposition assembly 104 includes a sputtering system operatively coupled to a rotatable target. According to these embodiments, the sputtering system is configured to deposit at least one of first silicon-containing dielectric film 16, second silicon-containing dielectric film 18, third silicon-containing dielectric film 20, or transparent conductive film transparent conductive film 22 by sputtering from the rotatable target. According to a particular embodiment, second deposition assembly 104 includes a sputtering system 127 operatively coupled to a rotatable target for depositing film transparent conductive film 22 by sputtering of the rotatable target.

According to certain embodiments, at least first deposition assembly 102 includes a sputtering system operatively coupled to a rotatable target for deposition of at least one of first silicon-containing dielectric film 16, second silicon-containing dielectric film 18, or third silicon-containing dielectric film 20 by MF sputtering of a rotatable target. According to certain embodiments, at least first deposition assembly 102 includes a sputtering system operatively coupled to a rotatable target for deposition of at least first dielectric film 16 and second dielectric film 18 by sputtering of a rotatable target.

According to certain embodiments, first deposition assembly 102 and second deposition assembly 104 include a plurality of targets, wherein one, some or all of the targets may be rotatable, configured in a manner such that first dielectric film 16, second dielectric film 18, third dielectric film 20, and transparent conductive film 22 can be deposited by sputtering of the targets. In the exemplary embodiment, each of the deposition chambers of deposition apparatus 100 includes a sputtering system. In particular, first dielectric film deposition chamber 106 is provided with sputtering system 120, second dielectric film deposition chamber 108 is provided with sputtering system 123, third dielectric film deposition chamber 110 is provided with sputtering system 125, and conductive film deposition chamber 112 is provided with sputtering system 127.

In particular, according to certain embodiments, each of the deposition systems in deposition apparatus 100 is operatively coupled to a respective rotatable target for deposition of the respective film. In the exemplary embodiment, sputtering system 120 is operatively coupled to a target 122 (which, e.g., may be a rotatable target or adapted for a planar cathode), sputtering system 123 is operatively coupled to a target 124 (which, e.g., may be a rotatable target or adapted for a planar cathode), sputtering system 125 is operatively coupled to a rotatable target 126 (which, alternatively may be adapted, e.g., for a planar cathode), and sputtering system 127 is operatively coupled to a target 128 (which, e.g., may be a rotatable target or adapted for a planar cathode). According to typical embodiments, a rotatable target is formed by one or more cylindrical targets suitably arranged for depositing a film over substrate 14. Typically, the rotatable silicon targets are provided by sprayed silicon targets.

According to typical embodiments, sputtering may be performed by reactive sputtering, whereby processing gases are used in order to determine the type of dielectric layers, e.g. SiO2 or Si3N4.

According to typical embodiments, deposition apparatus 100 includes a measurement system 138 configured for measuring during deposition optical properties of at least one of the films forming part of first transparent layer stack 12 or transparent conductive film 22. For example, deposition apparatus 100 may implement inline optical spectrophotometric measurement during the deposition of the films. Thereby, an online monitoring of the deposition process is enabled.

Deposition apparatus 100 may include a control system 142 operatively coupled to measurement system 138 for closed loop control of the deposition of at least one of the films forming part of at least one of first transparent layer stack 12 or the transparent conductive film. Thereby, the deposition of each layer may be individually controlled, so that film thickness, composition, or optical properties may be controlled with high precision. An individual control of film properties facilitates the formation of a stable transparent body having an optimized light transmittance.

According to typical embodiments, deposition apparatus 100 includes a temperature control system (not shown) for controlling the temperature at different areas of the deposition path, or other modules of deposition apparatus 100, such as a pre-treatment module, or a post-processing module. Furthermore, according to certain embodiments, such a temperature control system may individually control the temperature of substrate 14 at a deposition chamber.

The exemplary embodiment of FIG. 2 may also include a pre-treatment chamber 136 for performing a pre-treatment of substrate 14 prior to deposition. For example, pre-treatment chamber 136 may be configured to perform DC and/or MF pre-treatment of substrate 14 with a power between 1 or 3 kW (depending on substrate speed). Moreover, pre-treatment chamber 136 may be configured for performing pre-treatment of substrate 14 at an argon and/or oxygen atmosphere, so that, for example, an oxygen rich pre-treatment may be performed.

According to certain embodiments, deposition apparatus 100 may include a patterning chamber 114 for performing patterning of transparent body 10. In particular, patterning chamber 114 may include a sputtering system 130 for patterning of transparent conductive film 22, for example by etching thereof. Thereby, transparent body 10 may be fabricated for being suitable for a touch panel implementing projected capacitive touch. In typical embodiments, patterning chamber 114 may be configured for forming an X-Y grid by patterning (e.g., etching) of transparent conductive film 22, so that a grid pattern of electrodes if formed over substrate 14. In this case, a transparent body 10 according to embodiments herein is particularly advantageous since compensation of the variation of reflectance over the display area due to a patterned conductive layer is facilitated without compromising stability and quality of the transparent body, as discussed above.

According to typical embodiments, substrate 14 consists of a flexible substrate, such as a hardcoated PET foil, and deposition apparatus 100 may include an unwind roller 132 and a rewind roller 134 for unwinding of substrate 14 prior to deposition and winding of substrate 14 after formation of a transparent body according to embodiments herein. Deposition apparatus 100 may include a roller system (not shown) for translation of substrate 14 through the different processing chambers. In particular, a deposition apparatus according to embodiments herein may be constituted as a sputter roll coater for roll-to-roll deposition on a plastic film.

Figure 3:
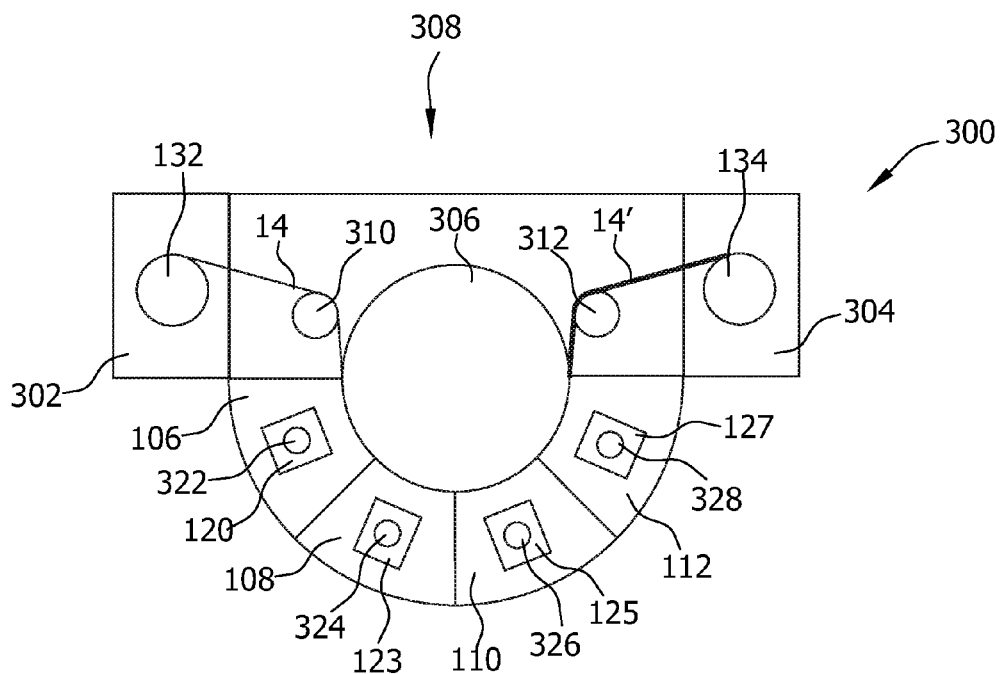
FIG. 3 is a schematic representation of another exemplary deposition apparatus for manufacturing of a transparent body for use in a touch panel in accordance with embodiments herein.

Within the following description of the drawings, the same reference numbers refer to similar components. Generally, only the differences with respect to the individual embodiments are described. FIG. 3 shows an exemplary deposition apparatus 300 for manufacturing of a transparent body for use in a touch panel in accordance with embodiments herein. Exemplary deposition apparatus 300 is constituted as a roll-to-roll system including an unwinding module 302, a winding module 304, and a process module 308 disposed therebetween. Process module 308 includes a first silicon-containing dielectric film deposition chamber 106, a second silicon-containing dielectric film deposition chamber 108, a third silicon-containing dielectric film deposition chamber 110, and a conductive film deposition chamber 112 similar to those discussed with regard to FIG. 2, but radially disposed about a processing drum 306.

Process module 308 may further include auxiliary rollers 310, 312 for appropriately feeding a substrate 14 to processing drum 306, and facilitating feeding of a processed substrate 14' from process module 308 to winding module 304. Deposition apparatus 300 may be a SmartWeb™, manufactured by Applied Materials, adapted for manufacturing a transparent body according to embodiments of the present disclosure. Examples of a roll-to-roll deposition apparatus, which could be adapted according to embodiments herein, are described in European patent application Appl. No. EP20040003574, entitled "Strip coating installation with a vacuum chamber and a coating cylinder" filed Feb. 18, 2004 and published under publication number EP 1 561 837 A1, which is incorporated herein by reference to the extent the application is not inconsistent with this disclosure.

According to certain embodiments, deposition apparatus 300 further includes additional processing modules for performing additional processing on substrate 14 or processed substrate 14'. Moreover, a plurality of deposition apparatuses 300 may be disposed in series for scaling productivity of a transparent body according to embodiments herein. Examples of a scalable deposition system, which could be adapted according to embodiments herein, are described in European patent application Appl. No. EP20040008699, entitled "Guide arrangement with at least one guide roll for guiding webs in web treating apparatuses" filed Apr. 13, 2004 and published under publication number EP 1 589 130 A1, which is incorporated herein by reference to the extent the application is not inconsistent with this disclosure.

In the exemplary embodiment of FIG. 3, sputtering system 120 is operatively coupled to a rotatable target 322 (which, alternatively may be adapted for a planar cathode), sputtering system 123 is operatively coupled to a rotatable target 324 (which, alternatively may be adapted for a planar cathode), sputtering system 125 is operatively coupled to a rotatable target 326 (which, alternatively may be adapted for a planar cathode), and sputtering system 127 is operatively coupled to a rotatable target 328 (which, alternatively may be adapted for a planar cathode).

Figure 10:
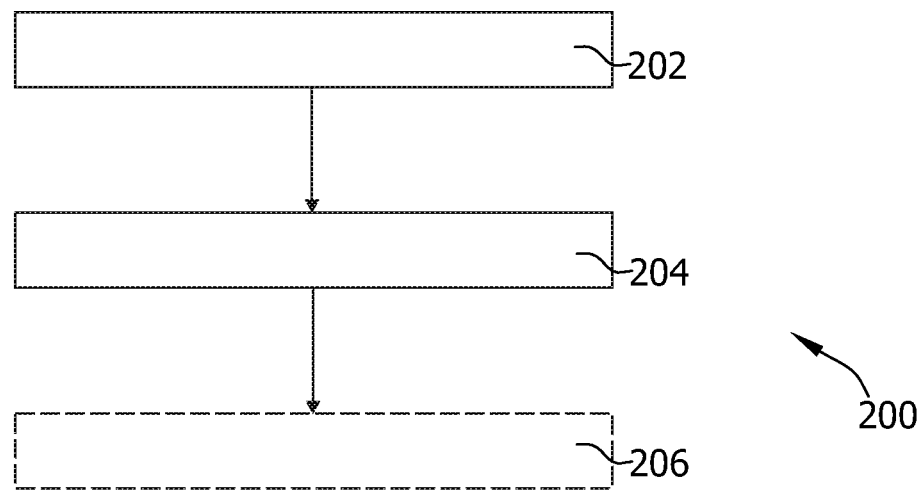
FIG. 10 is a flow chart illustrating an exemplary process for manufacturing a transparent body for use in a touch panel suitable.

FIG. 10 is a flow chart illustrating an exemplary process 200 for manufacturing a transparent body, such as exemplary transparent body 10. Such a process may be performed, for example, in any of the exemplary apparatuses of FIG. 2 or FIG. 3.

Exemplary process 200 includes depositing 202 a first transparent layer stack over a substrate, the first transparent layer stack including a first silicon-containing dielectric film, a second silicon-containing dielectric film, and a third silicon-containing dielectric film, the first and the third dielectric films having a low refractive index and the second dielectric film having a high refractive index. According to certain embodiments, deposition 202 is performed in a manner such that the first dielectric film, the second dielectric film, and the third dielectric film are disposed over the substrate in this order and, eventually, one atop another.

According to certain embodiments, the first silicon-containing dielectric film and/or the third silicon-containing dielectric film include or consist of silicon oxide (in particular, $SiO_2$). According to some embodiments, the second silicon-containing dielectric film includes or consists of silicon nitride (in particular $Si_3N_4$). Exemplary process 200 further includes depositing 204 a transparent conductive film in a manner such that the first transparent layer stack and the transparent conductive film are disposed over the substrate in this order. In exemplary process 200, at least one of the first dielectric film, the second dielectric film, the third dielectric film, or the transparent conductive film is deposited by sputtering from a rotatable target. Exemplary process 200 may further include patterning 206 the transparent conductive film. For example, a portion of the deposited transparent conductive film may be etched. According to certain embodiments, the transparent conductive film is patterned in a manner such that the transparent body is configured for being implemented into a projected capacitive touch panel. In particular embodiments, the transparent conductive film is patterned in a manner such that the transparent body is configured for being implemented into a mutual capacitive sensor of a touch panel.

According to certain embodiments, exemplary process 200 includes a heating treatment of the substrate for degassing of the substrate prior to deposition. For example, the substrate may be heated at a temperature between 60 and 200° C. depending on the substrate speed. According to certain embodiments, exemplary process 200 may include performing a DC and/or medium frequency (MF) pre-treatment of the substrate with a power between 1 or 3 kW (depending on substrate speed). Moreover, exemplary process 200 may include performing a pre-treatment of the substrate at an argon and/or oxygen atmosphere such as, for example, an oxygen rich pre-treatment. According to embodiments herein, medium frequency is a frequency in the range of 5 kHz to 100 kHz, for example, 30 kHz to 50 kHz.

The sputter coating sources in the exemplary deposition apparatuses or in an apparatus according to embodiments herein may be a DC-cathode with planar or rotatable targets (such as, but not limited to, ceramic ITO), and planar or rotatable targets (such as a doped silicon target, in particular sprayed Si targets for depositing $SiO_2$ or $Si3N4$,). According to typical embodiments, the films of the transparent body are deposited in one continuous run. In particular, the films may be deposited with different partial gas pressures (e.g., $O_2$ partial pressure) in the individual deposition chambers.

As a further step, the process 200 can include switching to the manufacturing of a different type of transparent dielectric layer stack for a touch panel. Thereby, for example, the apparatus can be stopped either after finishing deposition on a roll of the flexible substrate or during deposition on a roll of flexible substrate. The process gases can be exchanged such that only one SiO2 containing layer is deposited or one SiO2 containing layer is deposited on one Si3N4 containing layer in order to generate a single-layer transparent stack or a dual layer transparent stack. Thereby, particularly two or more silicon target assemblies can be used for deposition of one layer.

For example, referring to FIG. 3 if a Si3N4/SiO2-stack is to be manufacture, wherein the SiO2 layer has a larger thickness than the Si3N4 layer, target 322 can be used for the Si3N4 layer and both targets 324 and 326 can be used for the SiO2 layer. Thereby, the processing speed, which is typically limited by the layer with the largest ratio of layer thickness and deposition rate, can be improved as the thick SiO2 layer can be manufactured by utilizing more than one target assemblies 324 and 326.

According to typical embodiments, the at least three silicon containing target assemblies, e.g. rotatable MF Twin-cathodes, allow for manufacturing of at least a standard ITO transparent body, a first invisible ITO transparent body, a high transmittance ITO transparent body and second invisible ITO transparent body without the need of opening the apparatus for target exchange. Further, additional the same apparatus can also be applied for other antireflection coatings on substrates without the need of opening the apparatus for target exchange. The standard ITO transparent body typically includes a substrate (e.g. a PET film) with a hard coat, a SiO2 layer and an ITO layer deposited on top of each other. Thereby, two of the three layers 16-20, which are shown in FIG. 1 can be omitted. The SiO2 layer is deposited with an MF sputtering process by reactive sputtering, for example, in the presence of an inert gas, such as argon, and oxygen in the deposition chamber. Further, a typical process pressure for the SiO2 dielectric film may be between $2 \times 10^{-3}$ and $8 \times 10^{-3}$ mbar. Further, typical deposition rates may be between 20 and 40 nm/min (when a planar cathode is used) or between 30 and 60 nm/min (when a cylindrical cathode is used.) The ITO is deposited with a DC sputtering process. Typically, the film thickness is 10 nm to 30 nm for the SiO2 layer and 10 nm to 30 nm for the ITO layer.

The first invisible ITO transparent body typically includes a substrate (e.g. a PET film) with a hard coat, a first SiO2 layer, a Si3N4 layer, a second SiO2 layer and an ITO layer deposited on top of each other. The first and the third SiO2 layers are deposited with an MF sputtering process by reactive sputtering, for example, in the presence of an inert gas, such as argon, and oxygen in the deposition chamber. The Si3N4 layer is deposited with an MF sputtering process by reactive sputtering, for example, in the presence of an inert gas, such as argon, and nitrogen in the deposition chamber. Further, a typical process pressure for the dielectric films may be between $2 \times 10^{-3}$ and $8 \times 10^{-3}$ mbar. Further, typical deposition rates may be between 20 and 40 nm/min (when a planar cathode is used) or between 30 and 60 nm/min (when a cylindrical cathode is used.) The ITO is deposited with a DC sputtering process. Typically, the film thicknesses are 10 nm to 30 nm for the first SiO2 layer, 10 nm to 40 nm for the Si3N4 layer, 20 nm to 60 nm for the second SiO2 layer and 10 nm to 30 nm for the ITO layer.

The high transmittance ITO transparent body typically includes a substrate (e.g. a PET film) with a hard coat, a first SiO2 layer, a Si3N4 layer, a second SiO2 layer and an ITO layer deposited on top of each other. The first and the third SiO2 layers are deposited with an MF sputtering process by reactive sputtering, for example, in the presence of an inert gas, such as argon, and oxygen in the deposition chamber. The Si3N4 layer is deposited with an MF sputtering process by reactive sputtering, for example, in the presence of an inert gas, such as argon, and nitrogen in the deposition chamber. Further, a typical process pressure for the dielectric films may be between $2 \times 10^{-3}$ and $8 \times 10^{-3}$ mbar. Further, typical deposition rates may be between 20 and 40 nm/min (when a planar cathode is used) or between 30 and 60 nm/min (when a cylindrical cathode is used.) The ITO is deposited with a DC sputtering process. Typically, the film thicknesses are 10 nm to 30 nm for the first SiO2 layer, 30 nm to 80 nm for the Si3N4 layer, 30 nm to 90 nm for the second SiO2 layer and 10 nm to 30 nm for the ITO layer.

The second invisible ITO transparent body typically includes a substrate (e.g. a PET film) with a hard coat, a Si3N4 layer, a SiO2 layer and an ITO layer deposited on top of each other. Thereby, one of the three layers 16-20, which are shown in FIG. 1 can be omitted. The Si3N4 layer is deposited with an MF sputtering process by reactive sputtering, for example, in the presence of an inert gas, such as argon, and nitrogen in the deposition chamber. The SiO2 layer is deposited with an MF sputtering process by reactive sputtering, for example, in the presence of an inert gas, such as argon, and oxygen in the deposition chamber. Further, a typical process pressure for the dielectric films may be between $2 \times 10^{-3}$ and $8 \times 10^{-3}$ mbar. Further, typical deposition rates may be between 20 and 40 nm/min (when a planar cathode is used) or between 30 and 60 nm/min (when a cylindrical cathode is used.) The ITO is deposited with a DC sputtering process. Typically, the film thicknesses are 10 nm to 40 nm for the Si3N4 layer, 20 nm to 60 nm for the SiO2 layer and 10 nm to 30 nm for the ITO layer.

In light of the fact that similar targets (at least three silicon-containing targets and at least one ITO target) are used, switching between the different types of transparent bodies can be realized.

It is noted that for calculating reflectance in graph 418 in FIG. 4 and graph 518 in FIG. 5, it was assumed a PET substrate (refractive index 1.60) with backside reflection and without an outer substrate and without beam reverse, an air medium (refractive index 1.00), and light incidence angle of 0 degrees. Furthermore, the b* values in FIGS. 7 and 8, as indicated in the figures, refer to reflection with 2 degrees and light source D65.

Figure 11:
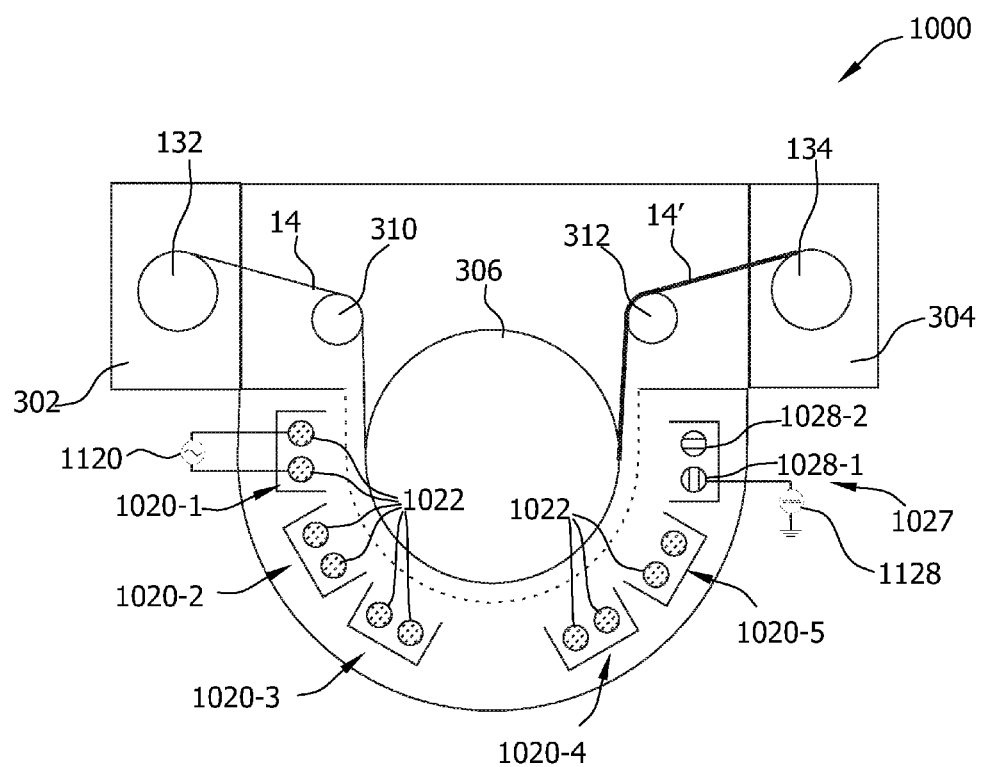
FIG. 11 is a schematic representation of another exemplary deposition apparatus for manufacturing of a transparent body for use in a touch panel in accordance with embodiments herein.

FIG. 11 schematically illustrates an example of a deposition apparatus 1000 for manufacturing a transparent body for use in a touch panel according to embodiments herein. The exemplarily apparatus includes a first deposition assembly having five target assemblies 1020-1 to 1020-5 and configured to deposit a first transparent layer stack 12 over a substrate 14, the first transparent layer stack 12 including a first silicon-containing dielectric film 16, a second silicon-containing dielectric film 18 and a third silicon-containing dielectric film 20. According to typical embodiments, each film of layer stack 12 is deposited in an individual deposition chamber or individual compartments of a deposition chamber. The exemplary deposition apparatus 1000 also includes a second deposition assembly configured to deposit a transparent conductive film 22.

According to embodiments herein, first deposition assembly and second deposition assembly are arranged such that first transparent layer stack 12 and transparent conductive film 22 are disposed over substrate 14 in this order. In the exemplary embodiment, substrate 14 is conveyed through the chamber by a conveyor system (not shown) along a deposition path in a deposition direction 140. In the exemplary embodiment, first deposition assembly is arranged upstream relative to second deposition assembly, so that transparent conductive film 22 is deposited over first transparent stack 12.

According to typical embodiments, deposition apparatus 1000 is configured to deposit the first and the third dielectric films having a low refractive index and the second dielectric film having a high refractive index.

According to some embodiments, which an be combined with other embodiments described herein, the apparatus 1000 can include 6 compartments, chambers or sub-chambers, such that each compartment can be operated under individual processing parameters, particularly with individual processing gases. As shown in FIG. 11, the apparatus can include five rotatable MF cathodes or target assemblies 1020-1 to 1020-5 equipped with sprayed Si target tubes 1022. The other one compartment is equipped with a target assembly 1027 with two ITO rotatable targets 1028-1 and 1028-2 powered in DC mode. Alternatively, an apparatus with six compartments or chambers can include four rotatable MF cathodes or target assemblies equipped with sprayed Si target tubes. The other two compartments or chambers are equipped with target assemblies having ITO rotatable targets powered in DC mode.

Thereby, a three-layer transparent layer stack having three silicon-containing dielectric films can be manufactured more efficiently, e.g. by having one or more of the three layers manufactured by two or more target assemblies 1020. Accordingly, each one of a SiO2 or Si3N4 layer having a thickness, which is larger than the thicknesses of the other dielectric films, and/or having deposition parameters, which result in a deposition rate being smaller than the deposition rate of the other dielectric films, can be manufactured by two or more target assemblies. Thereby, a limitation of throughput by this layer can be avoided or reduced. This applies similarly to a two-layer transparent layer stack having two silicon-containing dielectric films and even to a one-layer transparent layer stack having one silicon-containing dielectric film, wherein the thickness of the one silicon-containing film can be provided also by two or more silicon target assemblies.

As described above, the MF-cathodes with Si targets 1022 allow for a deposition of SiO2 as a low refractive index layer when Ar/Oxygen is used as a sputter gas. Alternatively Si3N4 (Silicon-Nitride) with a high refractive index layer can be deposited by using Ar/N2 sputter gas. This offers the advantage that several types of touch panel coating can be deposited with the same cathode/target arrangement.

As shown in FIG. 11 exemplarily for one target assembly 1020-1 only, and for one target 1028-1 only, the respective MF- and DC-power supplies 1120 and 1128 are provided. The other target assemblies and targets are correspondingly equipped (not shown).

According to yet further embodiments, particularly the compartments equipped with target assemblies 1027, which are operated in a DC sputtering, can have different targets 1028-1 and 1028-2 in the compartment. For example, two types of ITO material can be used for transparent conductive oxide films, e.g. with composition 90% In2O3 and 10% SnO2 for non-crystalline ITO or with composition 97% In2O3 and 3% SnO2 for crystalline ITO (after a tempering step). In FIG. 11 this is indicated by different targets 1028-1 and 1028-2. Accordingly, the flexibility of the apparatus can further be increased if in the ITO target section (target assembly 1027 in FIG. 11) one rotatable cathode is equipped with 90/10 ITO and the other rotatable with 97/3 ITO. This allows also switching between non-crystalline and crystalline ITO by using either one of the cathodes.

According to yet further embodiments, which can be combined with other embodiments described herein, the apparatus with a plurality of silicon-containing targets adapted for manufacturing of different silicon based dielectric films, particularly with different refractive indexes, allows for switching between different types of transparent layer stacks for touch panels. For example, a layer stack can be formed by one of the group consisting of:
PET film/SiO2/ITO; PET film/SiO2/Si3N4/SiO2/ITO as improved color reflection layer, PET film/SiO2/Si3N4/SiO2/ITO as high transmittance structure; and PET film/Si3N4/SiO2/ITO as improved color reflection layer with three layers.

According to yet further embodiments, the apparatus 1000 shown in FIG. 11 and having 6 compartments, target assemblies or cathodes, can also be further scaled up, e.g. to 8 10 or even 12 compartments, target assemblies or cathodes. Typically, at least the throughput can be increased by such an up scaling, because the layer limiting the speed of the substrate based upon layer thickness and/or deposition rate can be deposited with an additional cathode. In light of the similarity of the cathodes, this increase in throughput can be realized for all layer stacks, wherein the throughput is delimited by a silicon-containing layer deposition. In the event the throughput would mainly be delimited by an ITO layer deposition, a second one of the cathode assemblies can be equipped with ITO targets.

According to yet further embodiments, which can be combined with other embodiments described herein, the flexibility of the manufacturing methods and of the apparatuses is further provided by the option to deposit anti-reflection coatings with a layer stack of silicon-containing dielectric layers having different refractive indexes, e.g. a grading of refractive indexes. Thereby, the costs of ownership of such an apparatus can further be reduced by utilizing the system without the need to vent and re-evacuate the chamber.

Embodiments described herein relate to methods and apparatuses where only two target materials are used. This enables an operator of a deposition apparatus to switch from one process to the next process only by changing sputter parameters. There is no need for further target exchange. Without venting and replacing targets, the customer can produce different types of touch panel coatings. It is also possible to deposit different types of touch panel coatings on the same roll of plastic material without venting and opening the machine. This improves the cost of ownership for the customer and gives him additional value. Another advantage is the target price of sprayed Si compared to the target price of the high index material Niobium Oxide (Nb2O5), which might also be used for multi-layer transparent stacks for touch panel applications.

The written description uses examples to disclose the invention, including the best mode, and to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the examples of embodiments and embodiments or modifications thereof described above may be combined with each other.

The patentable scope of the invention is defined by the claims, and may include other examples that occur to those skilled in the art. Such other examples are intended to be within the scope of the claims.

While the foregoing is directed to embodiments of the invention, other and further embodiments of the invention may be devised without departing from the basic scope thereof, and the scope thereof is determined by the claims that follow.

The invention claimed is:

1. A process for manufacturing a transparent body for use in a touch panel, the process comprising:
a first stack formation process in a roll-to-roll deposition apparatus, the first stack formation process comprising:
depositing a first transparent layer stack over a substrate, said first transparent layer stack including a first silicon-containing dielectric film comprising $SiO_2$, a second silicon-containing dielectric film comprising $Si_3N_4$ directly contacting the first silicon-containing film, and a third silicon-containing dielectric film comprising $SiO_2$ directly contacting the second silicon-containing film, and depositing a transparent conductive film comprising ITO directly contacting the third silicon-containing dielectric film, the first and the third silicon-containing dielectric films having a low refractive index and the second silicon-containing dielectric film having a high refractive index, wherein the first silicon-containing dielectric film, the second silicon-containing dielectric film, the third silicon-containing dielectric film, and the transparent conductive film are deposited by sputtering from targets in the roll-to-roll deposition apparatus; and
maintaining a vacuum after depositing the first transparent layer stack and after depositing the transparent conductive film; and
switching to a second stack formation process in the roll-to-roll deposition apparatus, the second stack formation process comprising:
depositing a second transparent layer stack over the substrate, said second transparent layer stack selected from the group consisting of: a stack consisting of a $SiO_2$-containing layer; a stack consisting of an $SiO_2$-containing layer, a $Si_3N_4$-containing layer and a $SiO_2$-containing layer; and a stack consisting of an $Si_3S_4$-containing layer and a $SiO_2$-containing layer, wherein the second transparent layer stack and a second transparent conductive film are deposited by sputtering from targets in the roll-to-roll deposition apparatus; and
depositing in a manner such that the first transparent layer stack, the transparent conductive film, the second transparent layer stack, and the second transparent conductive film are disposed over the substrate in this order.

2. The process according to claim 1, further comprising patterning the transparent conductive film.

3. The process according to claim 1, wherein the first and the third silicon-containing dielectric films have a refractive index lower than 1.5 and the second silicon-containing dielectric film has a refractive index of at least 1.8.

4. The process according to claim 1, wherein the second silicon-containing dielectric film includes silicon nitride.

5. The process according to claim 1, wherein the first transparent layer stack including the first, second, and third silicon-containing dielectric films are sputtered by MF sputtering, and the transparent conductive film is sputtered by DC sputtering.

6. The process according to claim 1, wherein the first silicon-containing dielectric film is a $SiO_2$ layer with at least 90 weight-% of $SiO_2$, the second silicon-containing dielectric film is a $Si_3N_4$ layer with at least 70 weight-% of $Si_3N_4$, and the third silicon-containing dielectric film is a $SiO_2$ layer with at least 90 weight-% of $SiO_2$.

* * * * *

UNITED STATES PATENT AND TRADEMARK OFFICE
CERTIFICATE OF CORRECTION

PATENT NO. : 9,856,554 B2
APPLICATION NO. : 14/343125
DATED : January 2, 2018
INVENTOR(S) : Hans-Georg Lotz It is certified that error appears in the above-identified patent and that said Letters Patent is hereby corrected as shown below:

In Column 3, Line 50, delete "ore" and insert -- or --, therefor.

In Column 4, Line 28, delete "S3N4," and insert -- Si3N4, --, therefor.

In Column 4, Line 48, delete "S3N4" and insert -- Si3N4 --, therefor.

In Column 15, Line 27, delete "Si3N4,)." and insert -- Si3N4). --, therefor.

In Column 17, Line 43, delete "an" and insert -- can --, therefor.

In Column 20, Line 24, in Claim 1, delete "$Si_3S_4$" and insert -- Si3N4 --, therefor.

Signed and Sealed this
Twenty-ninth Day of May, 2018

Andrei Iancu
*Director of the United States Patent and Trademark Office*